United States Patent [19]

Butler

[11] 4,075,034
[45] Feb. 21, 1978

[54] SOLAR CONVERTER

[76] Inventor: David M. Butler, 46 Farragut Road, Annapolis, Md. 21403

[21] Appl. No.: 766,576

[22] Filed: Feb. 8, 1977

[51] Int. Cl.² .............................................. H01L 31/02
[52] U.S. Cl. .......................... 136/89 PC; 136/89 AC; 250/203 R; 350/293
[58] Field of Search ..................... 136/89 PC, 89 AC; 250/203 R; 350/293

[56] References Cited
U.S. PATENT DOCUMENTS 588,177  8/1897  Reagan ................................. 136/206

OTHER PUBLICATIONS

Fisher, Popular Science, vol. 207, No. 4, Oct. 1975, pp. 88 to 90.

Primary Examiner—Leland A. Sebastian
Attorney, Agent, or Firm—Nicholas J. Aquilino

[57] ABSTRACT

A solar energy converter for producing variable amplitude alternating current waveforms directly from solar energy including a photo-voltaic cell bank array, formed of a plurality of weighted photo-voltaic segments, a multi-sided, high speed, rotating, light concentrating, concave mirror and a servo means for tracking the sun. Rotation of the mirror past the weighted segments of the photo-voltaic bank produces instantaneous outputs which are proportional to the number of cells scanned in each segment. By suitable arrangement of the photo-voltaic segments, a simulated AC waveform is produced.

12 Claims, 5 Drawing Figures

SOLAR CONVERTER

BACKGROUND OF THE INVENTION

The ongoing world wide energy crisis and the increasingly higher cost of fossil type fuel has generated a search for alternate fuel sources. Among the sources which appear the most promising are nuclear fuel, geothermal energy and solar energy. To date, much has been done in the area of developing solar energy, primarily in the area of direct heating of fluid or air by the sun's rays to produce heat. Also, the use of solar voltaic cells and batteries to generate a DC source of electricity is a well known power source in many areas including outer space applications. However, much of the DC power produced requires conversion to AC energy to be useful. To date, the closest approximation of direct conversion of alternating current from solar radiation has required the use of some type of DC to AC converter.

SUMMARY OF THE INVENTION

It is, therefore, a general object of the present invention to provide a solar converter for directly producing predetermined types of waveforms from solar energy and, more specifically, to produce alternating current directly from solar voltaic cells without the need for DC to AC conversion apparatus.

In accordance with the present invention, the foregoing objects of the invention are attained by providing a solar energy converter for producing AC current directly by scanning a weighted solar voltaic cell array with solar energy. More specifically, the solar converter system of the present invention includes a multisided, high speed, rotating, light concentrating mirror which images solar energy on weighted photo-voltaic cell segments to produce high energy pulsed outputs of different energy level outputs which are instantaneously proportional to the number of cells in a particular alignment in the array. In a preferred embodiment, the solar voltaic cells are arranged to produce a simulated AC waveform as they are scanned with solar energy.

DESCRIPTION OF THE PREFERRED EMBODIMENTS

Figure 1:
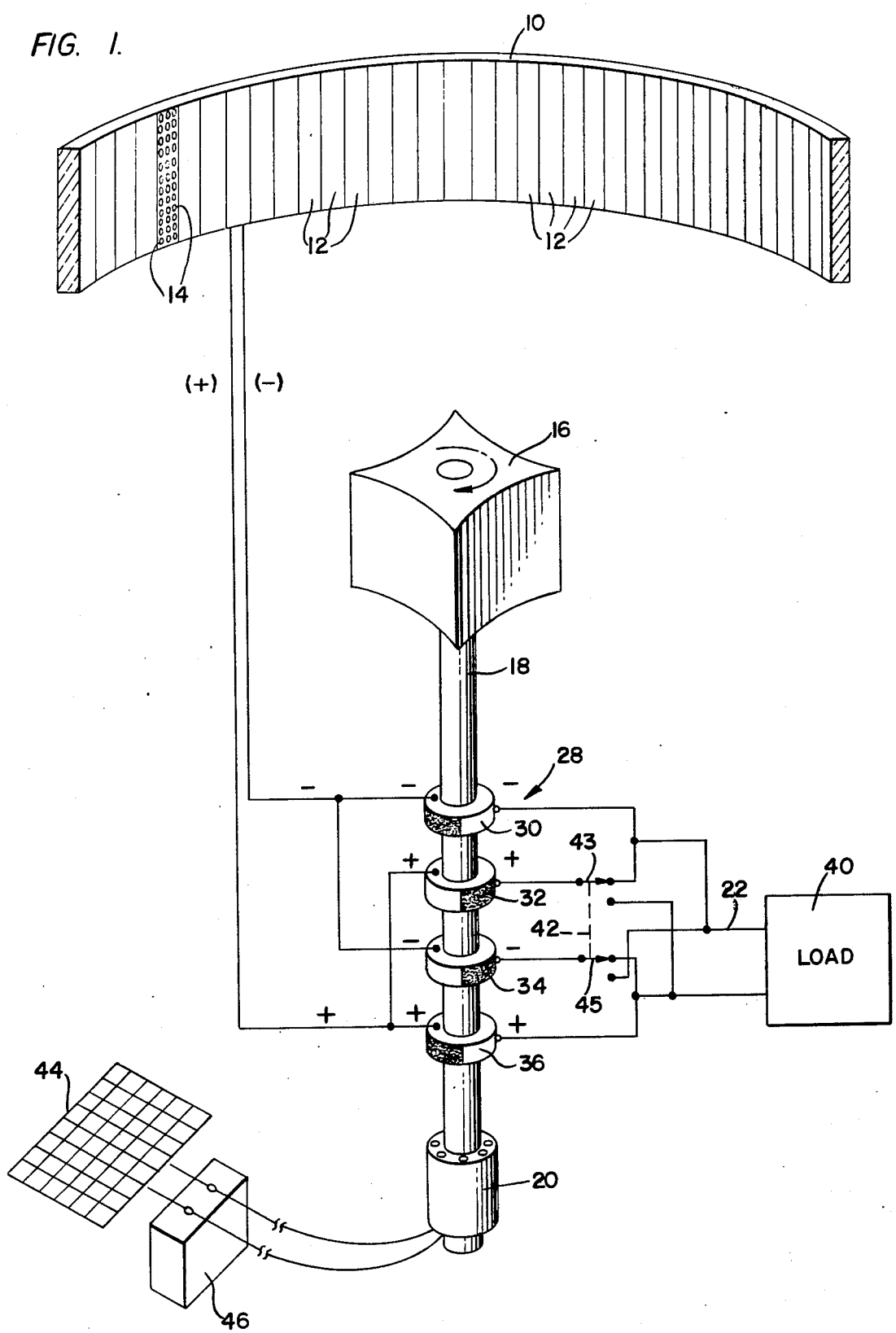
FIG. 1 is a schematic perspective view of the present invention.
Figure 4:
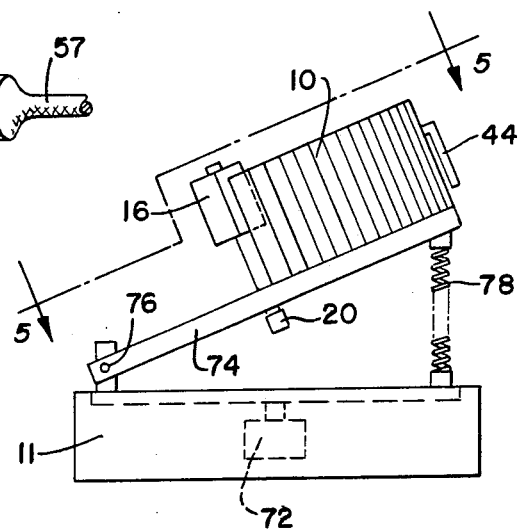
FIG. 4 is a schematic view of the tracking system of the invention.
Figure 5:
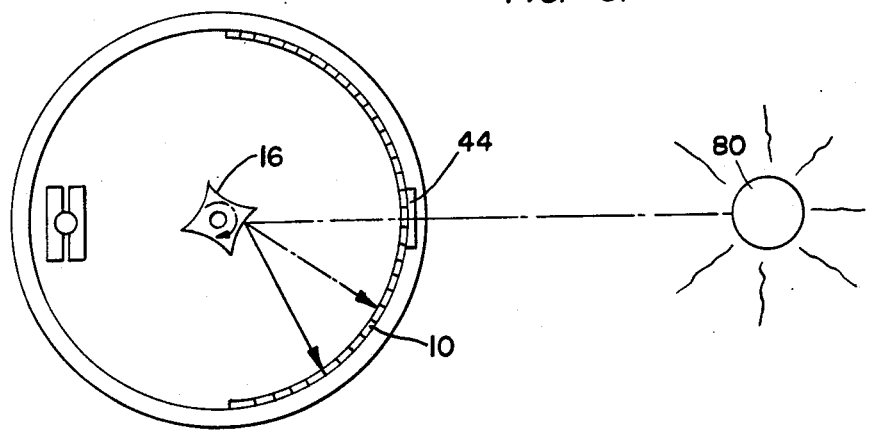
FIG. 5 is a top plan view of the solar energy converter.

As seen with respect to FIGS. 1, 4 and 5 of the drawings, the solar energy converter includes a bank 10 of solar cells mounted on a base member 11 which is rotatable with respect to the sun. The bank 10 is divided into a plurality of vertically disposed segments 12. The bank is a flat type collector, semi-circular in form. Each segment 12 contains a weighted number of individual solar cells 14 which are connected to electrical circuits to collect the current produced when they are activated by solar energy. By a suitable arrangement of series-parallel interconnections and switching systems, the output of the solar cell segments 12, when properly arranged, is used to produce a predetermined waveform which, in a preferred embodiment, takes the form of a simulated AC sine wave. One output line (+) from the solar bank 10 is positive and a second output line (−) is negative.

A quad, light concentrating mirror 16, having four concave reflecting surfaces, is mounted on a shaft 18 at the center of the arc described by the curved solar cell bank 10. The mirror 16 produces a concentrated light beam of rectangular configuration which is vertically disposed so as to scan each vertical segment 12, as the mirror is rotated on its shaft 18 by a motor 20.

Although not shown, it will be appreciated that a suitable mounting means for the motor and shaft assembly is used.

A four tier, slip ring polarity switch 28 includes individual slip ring sections 30, 32, 34 and 36. The switch assembly is mounted on the shaft 18 and rotates concurrently therewith. The slip ring switch 28 is connected to the positive (+) and negative (−) outputs of the solar cell bank 10. The positive output line (+) is connected to slip ring sections 32 and 36 and the negative output line (−) is connected to slip ring sections 30 and 34.

The load 40 is connected to the slip ring switch 28 so that alternate conductive and insulated sectors of each of the slip ring sections 30, 32, 34 and 36 are engaged to produce alternate positive and negative outputs. One load line 22 is connected to negative slip ring 30 and also to positive slip ring 32. A second load line 24 is connected to slip ring sections 34 and 36, negative and positive respectively.

A manual switch 42 is included in the line between the load 40 and the slip ring switch 28. An upper contact 43 of switch 42 is movable to connect slip ring 32 to the load line 24 and a lower contact 45 is movable to connect slip ring 34 to load line 22. In this way, the switch 42 is used to connect the load so that it receives either a simulated AC waveform or a rectified AC waveform. With the switch in the normal position, an AC waveform is produced at the load and with the switch 42 in the lower position, the load receives DC only. Thus, by providing a battery bank as the load, the system may be used to store energy as well as providing it directly.

The system further includes an auxiliary power solar bank 44 which charges a battery bank 46 used to power the motor 20. The solar bank 44 is preferably fixed somewhere on the main solar bank 10 where it will always face the sun 80. Suitable voltage control devices, such as regulators or converters (not shown), may be used in conjunction with the solar bank 44.

Figure 2:
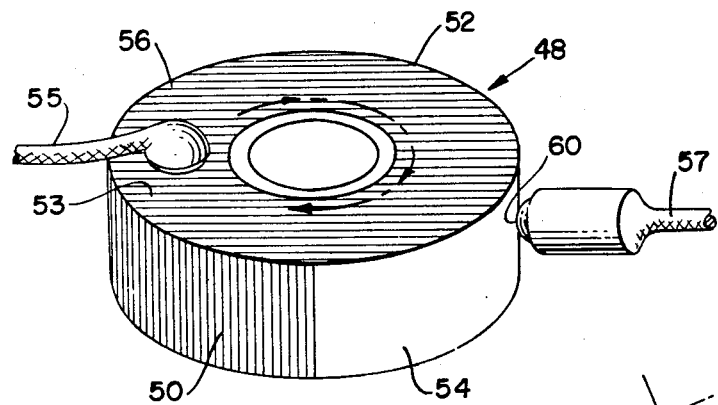
FIG. 2 is a perspective view of a detail of FIG. 1.

FIG. 2 illustrates a more detailed view of a slip ring used in the four tier polarity switch 28. The slip ring 48 includes oppositely disposed sectors 50 and 52 which are conductive and sectors 54 and 56 which are formed of insulating material. The lead 55 from the solar bank 10 is fixed on a conductive portion 53 of the slip ring section 48. The lead 57 which is coupled to the load, terminates in a suitable ball conductor 60 which contacts the conductive and non-conductive sectors of the slip rings 48 as it rotates on the shaft.

Figure 3:
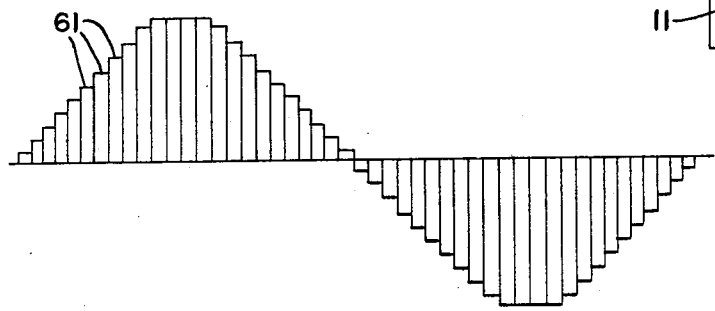
FIG. 3 shows a waveform produced by the system of FIG. 1.

FIG. 3 illustrates a sample of the simulated sinusoidal AC waveform produced by the subject invention, as seen at the load terminals. Each segment 61 of the waveform represents the output from a particular segment 12 of the solar bank having a weighted number of photo-voltaic cells. The segments are arranged so that each has a number of cells to produce a slightly greater or lesser output than the preceding segment as it is scanned by the concentrated solar energy reflected by the mirror 16. It can be seen from the drawing that ascending and descending output values are produced to simulate a sinusoidal curve. The lower half of the waveform is produced by switching polarity as described hereinabove.

FIG. 4 illustrates the tracking system used with the solar energy converter system. The base 11 is rotatable about a horizontal axis by means of a suitable drive means 72. The solar converter including the solar bank 10, the auxiliary solar bank 44 and the rotating mirror 16 and drive assembly 20 sits on a platform 74 which is pivoted at point 76. The platform 74 is capable of being pivoted upwardly or downwardly by a stepping motor drive unit 78. The movements of the system are controlled by a mini-computer or tape drive (not shown) so as to always aim the solar converter at the sun. The sun's coordinates for any given path may be preprogrammed in the memory of the computer control to compensate for seasonal changes in azimuth as well as the normal daily sun movements.

The operation of the solar converter will be described as follows. The sun 80 reflects energy onto the rotating mirror 16 which, in turn, scans the solar bank 10. The high speed sweep of the concentrated solar energy light produces a high energy electrical pulse from the cells without overloading them because each segment is subjected to the scanned energy for a short period of time. The auxiliary solar bank 44 is also aimed directly at the sun to produce the power for the battery bank 46 powering the scan motor 20 and for the tracking motor 72.

As seen in the drawing, each time the mirror rotates 90°, a complete scan of the solar bank occurs by one of the four reflecting surfaces of the mirror 16. At the end of a scan, or 90°, the polarity of the cell bank output is reversed because of the slip ring connections described hereinabove. Therefore, two scans of the solar bank 10 produces a complete waveform with both positive and negative parts of the cycle. This cycle is repeated every time the solar bank is scanned twice to produce a continuous simulated AC output. Therefore, each complete revolution of the mirror 16 produces two complete periods of the waveform. This means the angular velocity required of the scan motor 20 is equal to one half the desired frequency of the produced waveform (FIG. 3).

Inasmuch as the present invention is subject to many variations, modifications and changes in detail, it is intended that all subject matter described above or shown in the accompanying drawings be interpreted as illustrative and not in a limiting sense.

What is claimed is:

1. A solar energy converter for producing variable amplitude energy waveforms directly from solar energy comprising
a solar bank having an array of photo-voltaic segments, each segment including a variable number of photo-voltaic cells and being adapted to produce a weighted voltage output proportional to the number of photo-voltaic cells when activated by solar energy;
means for reflecting concentrated solar light onto said solar bank;
means for scanning said reflecting means across said solar bank; and
circuit means for connecting the output of said solar bank to a load.

2. The solar energy converter of claim 1 further including switching means for changing the polarity of the output of said solar converter.

3. The solar energy converter of claim 1 further including means for tracking the sun in order to position the converter facing the sun.

4. The solar energy converter of claim 1 further including an auxiliary solar bank to provide power to said solar converter.

5. The solar energy converter of claim 4 including a motor drive means to drive said scanning means, said motor drive means being powered by said auxiliary solar bank.

6. The solar energy converter of claim 2 including a second switching means connected in said output circuit to control the polarity of said waveforms.

7. The solar energy converter of claim 1 further including a battery power bank connected to said auxiliary solar bank.

8. The solar energy converter of claim 2 wherein said switching means is defined as a multi-tier switch comprising a plurality of slip ring connections.

9. The solar energy converter of claim 8 wherein said slip ring connections are formed of alternately conducting and insulating segments.

10. The solar bank of claim 1 wherein said segments are weighted in ascending and descending numbers of individual photo-voltaic cells to produce variable outputs.

11. The solar converter of claim 1 wherein said reflecting means comprises a multi-sided reflecting mirror having concave reflecting surfaces to produce a linear high energy light pulse.

12. The solar converter of claim 11 wherein said reflecting means is a four-side configuration and is concave with respect to its vertical axis to produce a vertical energy pulse and said solar bank segments are vertically disposed on said solar bank in order that the vertical energy pulse sequentially energize each of said solar bank segments.

* * * * *